United States Patent
Järvinen et al.

[11] Patent Number: 6,144,936
[45] Date of Patent: Nov. 7, 2000

[54] METHOD FOR SUBSTITUTING BAD SPEECH FRAMES IN A DIGITAL COMMUNICATION SYSTEM

[75] Inventors: Kari Järvinen; Janne Vainio, both of Tampere, Finland

[73] Assignee: Nokia Telecommunications OY, Espoo, Finland

[21] Appl. No.: 08/849,361

[22] PCT Filed: Dec. 5, 1995

[86] PCT No.: PCT/FI95/00667

§ 371 Date: Aug. 11, 1997

§ 102(e) Date: Aug. 11, 1997

[87] PCT Pub. No.: WO96/18251

PCT Pub. Date: Jun. 13, 1996

[30] Foreign Application Priority Data

Dec. 5, 1994 [FI] Finland ..................... 945735

[51] Int. Cl.[7] .................................... G10L 21/02
[52] U.S. Cl. .................... 704/226; 704/228; 704/225
[58] Field of Search .................. 704/226, 228, 704/265, 224, 225, 221, 220; 371/5.5, 31; 455/221, 222, 223, 212

[56] References Cited

U.S. PATENT DOCUMENTS

| | | | |
|---|---|---|---|
| 4,688,224 | 8/1987 | Dal Degan et al. ............ | 371/31 |
| 5,142,582 | 8/1992 | Asakawa et al. .............. | 704/228 |
| 5,255,343 | 10/1993 | Su . | |
| 5,293,449 | 3/1994 | Tzeng ........................ | 704/223 |
| 5,309,443 | 5/1994 | Schorman . | |
| 5,333,153 | 7/1994 | Brown et al. . | |
| 5,537,509 | 7/1996 | Swaminathan et al. ......... | 704/228 |
| 5,557,639 | 9/1996 | Heikkila et al. .............. | 375/224 |

FOREIGN PATENT DOCUMENTS

| | | |
|---|---|---|
| 581 477 | 2/1994 | European Pat. Off. . |
| 93/15559 | 8/1993 | WIPO . |
| 94/26036 | 11/1994 | WIPO . |

*Primary Examiner*—David R. Hudspeth
*Assistant Examiner*—Abul K. Azad
*Attorney, Agent, or Firm*—Pillsbury Madison & Sutro LLP

[57] ABSTRACT

When several successive bad frames are received, a speech signal applied to an audio speaker is muted after a certain period of time, whereby the user may switch the phone off even though it is possible for the transmission channel to regain its good quality. Instead of the muting of the phone, the user is, according to the invention, given a specific indication, a weak noise signal, for example, indicating that the call synthesization has been discontinued on purpose. The noise signal may be generated in a noise generator prior to a speech decoder, and the noise signal is summed with the attenuated parameter values of the frames substituted during subsitution process.

18 Claims, 4 Drawing Sheets ns is first channel
METHOD FOR SUBSTITUTING BAD SPEECH FRAMES IN A DIGITAL COMMUNICATION SYSTEM This application is the national phase of international application PCT/FI95/00667, filed Dec. 5, 1995 which was designated the U.S.

BACKGROUND OF THE INVENTION

1. Field of the Invention

The present invention relates to decoding a received signal in a receiver of a digital communication system. The invention particularly relates to handling of speech coding parameters obtained from a channel decoder prior to the actual decoding to be carried out in the speech decoder.

2. Description of Related Art

In systems transmitting speech in digital form, such as mobile radio systems, the speech signal is first coded by some method prior to channel coding and transmission on the radio path. Speech that is digitalized in the speech coding is handled on a frame-by-frame basis in time intervals of approximately 20 ms by utilizing various kinds of methods, resulting in a frame specific set of parameters which characterize the speech. This information, i.e. the set of parameters, is channel coded and transmitted to the transmission path. In the channel coding, the information is protected by various kinds of error correction codes.

Upon receiving a radio signal, the signal is first channel decoded, whereby the original speech frames are obtained unless the transmission channel has caused disturbances. Speech frames of good quality may directly be applied to the speech decoder and used for speech synthesization. As is well known, the radio path is more or less under disturbance, which means, also as far as communication systems transmitting speech over the radio path are concerned, that some of the transmitted speech frames may as a result of the transmission errors prove to be erroneous at the reception to such an extent that they cannot be used for speech synthesization. Even if such codes that efficiently correct errors were used to protect the information to be transmitted, the received parameter values may still include serious transmission errors. The most significant parameters to be transmitted are, for the above reason, protected not only by the aforementioned error correction code but also by an error protection code, such as a CRC check sum (Cyclic Redundancy Check), capable of detecting errors. The check sum coding is capable of detecting speech frames that are badly corrupted in the transmission channel, and, consequently, it is possible to block their use for speech synthesization. The blocking procedure is imperative in order for the badly corrupted speech parameters not to cause heavy interference, e.g. clicks, in the synthesized speech. Upon detecting that a speech frame has been received so badly corrupted in the transmission channel that it is no longer possible to use the frame for speech synthesization, the received frame is classified as "a bad frame". The bad frames are separated from the rest of the speech frames, which are consequently called "good frames". Under extreme conditions on the radio path, situations emerge during which several successive speech frames received must be rejected and speech frames might even be lost over a period of several seconds.

In present-day digital cellular communication systems, such as the GSM (Groupe Spécial Mobile), an efficient error correction coding is utilized, enabling transmission of speech with good quality even over a bad quality connection. When the error correction capability of the error correction finally at some stage is exceeded, the received speech frames can no longer be used for speech synthesization. In such a case, a substitution method for bad frames is initiated, utilizing the aforementioned classification of speech frames as good and bad ones.

In the substitution process, the parameter values of bad frames are substituted for parameter values that cause as little audible disturbance as possible. A method proved to be proficient is to substitute all the parameter values of a bad, frame for the parameter values of the last received frame that is classified as good, and to feed the speech coder repetitively with the substitution frame. By repeating previous parameters, speech can indeed be synthesized for a while without causing any disturbing listening sensation, but due to the speech signal characteristics changing heavily as a function of time, it is not possible to carry out the repeating of the parameters of the last good frame for very long. The aforementioned GSM system has a recommendation according to which the repeating is to be continued for 320 ms, maximum, after which such parameters are applied to the speech decoder, which completely mute its output. In the case of more than one successive bad frame, it is a known procedure to attenuate the speech signal which is obtained from the speech decoder already during the substitution process. This results in the speech signal obtained by the substitution method gradually attenuating during the substitution process. At least two attenuation methods can be discerned.

FIG. 1a is a block diagram illustration of a first embodiment of a prior art substitution method for bad frames, and of incorporating the substitution method into a speech decoder. This figure, as well as the latter figures, shows by means of a thick line transmission of several parallel speech coding parameters from a block to another. A channel decoding block 102 provides speech parameter values 103 that are channel decoded and error corrected. In case not very many serious errors have been detected in the speech parameters of the received speech frame 101, the speech parameters are applied to a speech decoder 108, and the speech parameters are utilized for synthesizing a speech signal to be applied to an audio speaker 110. If, however, the received speech frame is detected to be bad, the received speech parameters are not inputted to the speech decoder, but the speech parameters of the last good frame are used instead. A channel decoder provides a classification signal 106 indicative of the badness of the received speech frame. On the basis of the classification signal 106, a switch 107 will be controlled as follows: if a good frame has been received, the switch is in position 1, whereby the received parameters 103 are applied to the speech decoder 108. If a bad frame has been received, the switch is in position 2, whereby the parameters 105 received during the last good frame are applied to the speech decoder. The parameters 105 are obtained from the block 104 which stores the parameters of the last good speech frame received. When several successive bad speech frames are substituted the output of the speech decoder is attenuated during the substitution process in attenuation means 109. In the case of good frames, the means 109 has a zero attenuation.

FIG. 1c discloses how the attenuation of block 109 in FIG. 1a takes place on the basis of the classification signal 106 of bad frames. It illustrates the behaviour of an attenuation coefficient "a" as a function of the number of successive bad frames. The speech signal which has been decoded during the substitution process is attenuated by decreasing the value of the coefficient "a" so that the speech signal is the more attenuated the larger number of successive speech frames are lost, until the signal to be applied to the audio speaker is finally completely attenuated, i.e. muted. The horizontal axis of FIG. 1c indicates which successive frame in succession is being handled. If N=0, a good frame is being handled, meaning that there is no attenuation, and the speech decoder output inputted to the block 109 is applied as such to the audio speaker 110. If N=1, the first bad frame after a good frame is in question. There is usually no attenuation for such a first frame to be substituted, but it is also applied to the audio speaker without attenuation. But if the value of N=2, i.e. a second successive bad frame has been received, the attenuation of the speech decoder output is initiated prior to applying the output to the audio speaker. The larger number of successive bad frames are received, the more the speech signal generated by the substitution process is attenuated in the block 109.

FIG. 1b is a block diagram illustration of a second embodiment of a prior art substitution method for bad frames, and of incorporating the substitution method into a speech decoder. This embodiment is more commonly in use than the method of the first embodiment. According to the second embodiment, the attenuation of a speech signal to be synthesized during the substitution process is carried out prior to the speech decoder by handling the value of one or more speech coding parameters that influence the amplitude of the speech to be decoded so that the speech signal to be decoded is attenuated. For reasons of clarity, the following only deals with handling of one speech coding parameter having influence on the speech amplitude, although the desired attenuation may be achieved as a result of interaction of several parameters, depending on the coding algorithm. The implementation illustrated in FIG. 1b is similar to that of FIG. 1a, except that the speech decoder output is attenuated by attenuating, instead of the speech decoder output, a parameter influencing the amplitude of the speech signal to be synthesized during the substitution process, an example of such a signal being a gain parameter of an excitation signal in LPC (Linear Predictive Coding) type of speech decoders. The block 209 attenuates this parameter only, and other LPC coefficient parameters that influence, for example, frequency contents, are passed through as such to the switch 107. The parameter influencing the amplitude is attenuated by the attenuation parameter "a" beginning from the initial value the parameter had in the last good frame. Also in this case, the behaviour of the attenuation parameter "a" as a function of successive bad frames follows the curve illustrated in FIG. 1c.

A substitution process such as the one shown in FIG. 1b is disclosed in the GSM recommendation 06.11, which illustrates an algorithm according to which the attenuation of the amplitude of a speech signal obtained by a substitution process is initiated beginning from the second speech frame to be substituted. The attenuation is carried out by decreasing the Xmaxcr value of a gain parameter for excitation of an RPE-LTP (Regular Pulse Excitation—Long Term Prediction) speech coder. After the sixteenth successive bad frame, i.e. after the time of 320 ms, at the latest, such parameter values are applied to the speech decoder that completely mute the output of the speech decoder. Consequently, during a sequence of bad frames longer than this, the phone will be muted completely.

The prior art methods described above share the common feature that the substitution is sooner or later brought to a halt, causing a complete muting of the signal applied to the audio speaker. If the sudden muting of the phone lasts for several seconds, it is a very annoying experience for the person listening to the speech signal. The user will be left uncertain whether the connection has broken, whether the interlocutor has unexpectedly ceased talking, or whether the muting of the phone is a result of the received parameters having been classified as too erroneous, leading to intentional muting of the phone. Thus, the user may switch off the phone although it is possible for the transmission channel to regain such a good quality that the error correction coding is again capable for an adequate enough correction of the errors caused by the transmission channel, and classifies the received frames as good frames for speech synthesization.

It is an object of the present invention to provide a bad frame substitution method and a speech decoder by a receiver as claimed in claim 10.

SUMMARY OF THE INVENTION

According to the present invention, a receiver of a digital communications system for transmitting speech is provided. The receiver includes a channel decoder for forming speech frames and for providing a classification signal indicative of whether a received frame is correct or defective. Next, storing means stores a last correct speech frame and a switch responsive to the classification signal provides as an output, either of the speech coding parameters or the parameters of the last correct speech frame. A speech decoder, receives as an input, the output of the switch and produces a decoder output thereby. Finally, a device responsive to the classification signal, adds noise to the decoder output, adjusts the level of the noise in proportion to the output signal of the speech decoder, and provides an output to an audio speaker.

According to the invention, instead of muting of the phone, the called party is given a specific indication of the fact that speech synthesization has been discontinued on purpose, because the received frames were classified as bad frames and the connection did not completely break yet. This indication can be given to the phone user in a controlled manner, for example, as a weak noise signal. The magnitude of the noise signal generated during the substitution process is controlled in cooperation with controlling efficiency of repeating the previous speech parameters.

According to the first embodiment, the noise is summed with the output signal of the speech decoder. According to the second embodiment, the noise is summed with the parameter values of the frames applied to the speech decoder during the substitution process of bad frames. The noise may be such that it becomes stronger, whereby at the final stages of the substitution process, when the synthesization is not yet discontinued, the noise is weak but slowly becoming stronger. Upon complete ceasing of the synthesization, the noise is maintained on a constant level.

BRIEF DESCRIPTION OF THE DRAWINGS

In the following, the invention will be described by means of the attached diagrams, in which.

DESCRIPTION OF THE PREFERRED EMBODIMENTS

Figure 1A:
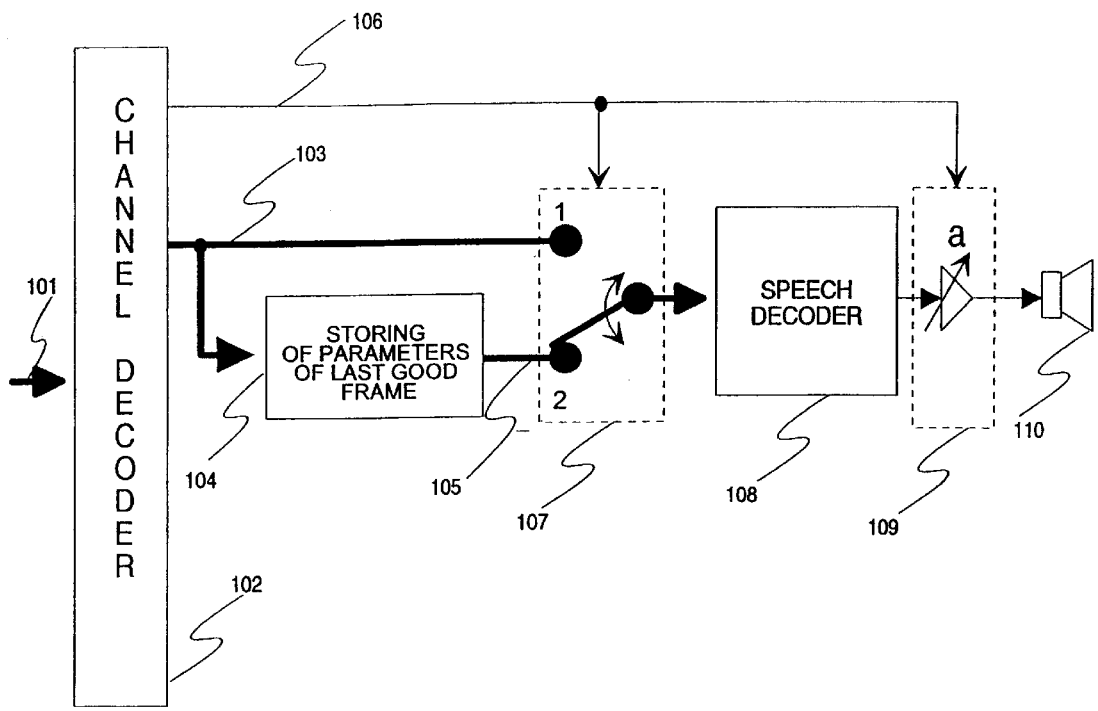
FIGS. 1a and 1b are block diagram representations of prior art substitution methods for bad frames.
Figure 2C:
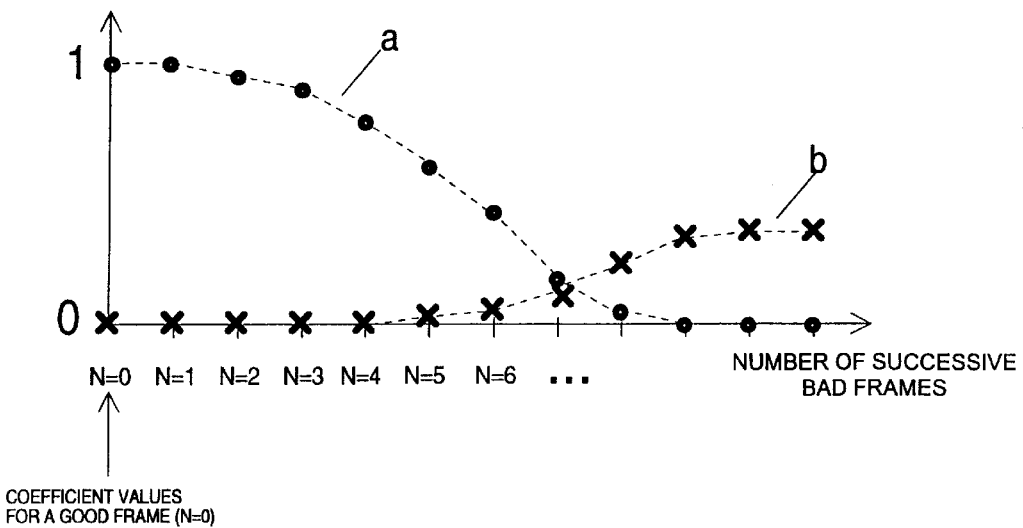
FIG. 2c illustrates a graph for the behaviour of an attenuation coefficient as a function of the number of successive bad frames.
Figure 2A:
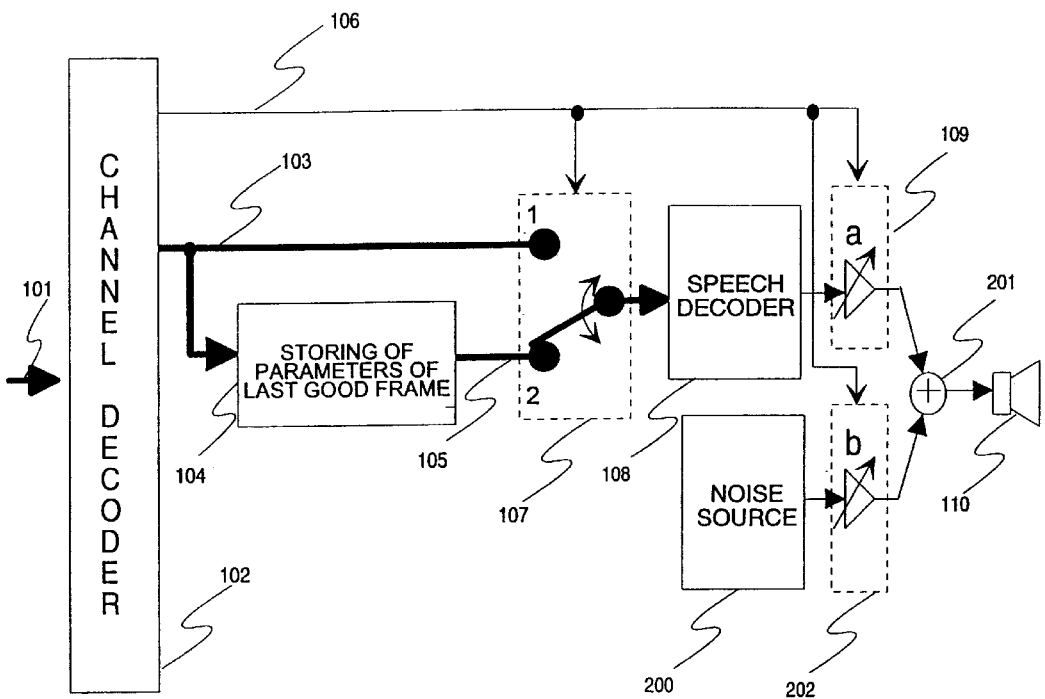
FIGS. 2a and 2b are block diagram representations of bad frame substitution methods according to the invention.

FIG. 2a illustrates a substitution process for bad frames according to the invention as applied to a solution of the prior art first embodiment shown in FIG. 1a. As can be seen, the figure includes same blocks as in FIG. 1a, and, accordingly, the same reference numbers are used in FIG. 2a, where appropriate. The difference to the method of FIG. 1a is that a noise source 200 is connected to the output of the speech decoder by means of a summing means 201, and that the information contained in the classification signal 106 on the badness of the received signal, apart from controlling an attenuator 109 connected to the speech decoder output, also controls an attenuator 202 connected to the noise source output. According to the invention, both of the attenuators 109 and 202 interact in the attenuation blocks so that both are controlled by the classification signal 106 of the frames by a method to be disclosed below.

The operation of the method of the invention differs from the operation of the receiver illustrated in FIG. 1a in that the signal to be applied to the audio speaker, which signal is formed at the receiver during a bad speech frame, is formed as a weighted sum of the noise signal obtained from the noise source 200 and the speech signal obtained from the speech coder 108 as having been synthesized using the substituted speech parameters, and not just as an attenuated output of the speech decoder. Upon receiving bad speech frames, the signal to be applied to the audio speaker is so formed that it is the more efficiently softly combined with noise signal from the noise source 200, the larger number of successive bad frames are received. When a large number of successive bad frames, for example, a number corresponding to 320 ms, have been received, the signal formed at the receiver to be applied to the audio speaker now only consists of a weak noise signal, whose magnitude is adjusted to a constant level.

The magnitude of the noise signal is controlled by a weighting coefficient "b", by means of which the magnitude of the noise signal to be summed is controlled in the block 202, and whose value depend on which bad frame in succession is in question.

FIG. 2c shows a graph for the behaviour of the attenuation coefficients "a" and "b" when substituting several successive bad frames. The attenuation coefficients "a" and "b" operate in opposite directions so that when the coefficient "a" decreases the coefficient "b" increases accordingly, as shown in FIG. 2c. Thus, the phone is not completely muted in the substitution of bad frames even if only bad frames were received for several seconds, but a weak noise signal, which is obtained from the noise source attenuated according to the attenuation coefficient "b", is applied to the audio speaker. The coefficient "b" is saturated during the substitution process so that the noise signal is of constant magnitude.

When good speech frames are received after a bad speech frame, the signal to be applied to the audio speaker is in a corresponding manner softly formed so that it is the less combined with the noise signal, the larger number of good speech frames are received, until the signal to be applied to the audio speaker is eventually formed solely on the basis of the speech parameters received from the transmission channel.

Figure 1B:
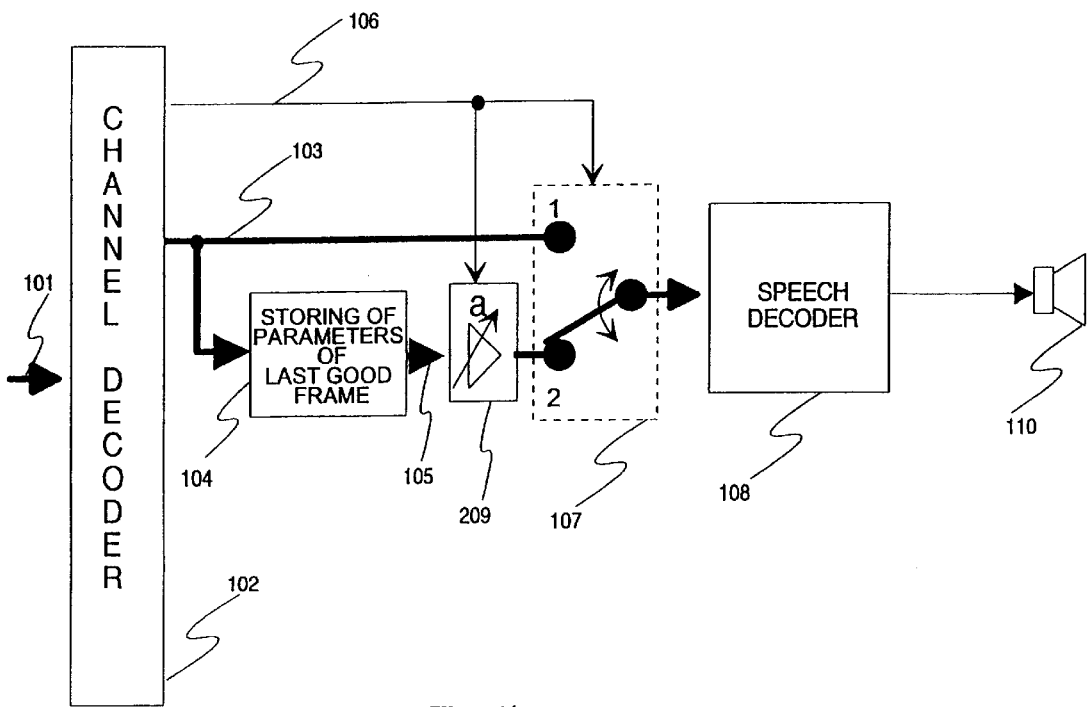
Figure 1C:
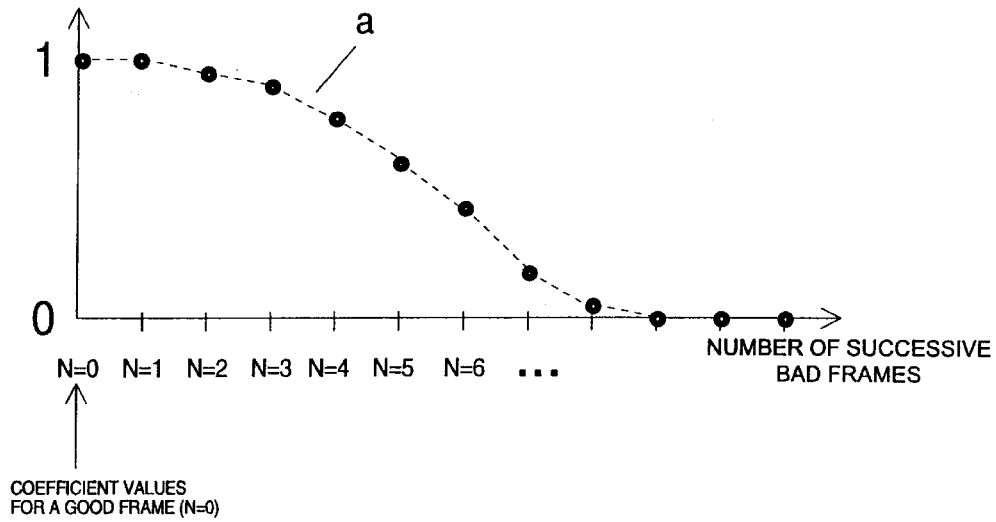
FIG. 1c illustrates a graph for the behaviour of an attenuation coefficient as a function of the number of successive bad frames.
Figure 2B:
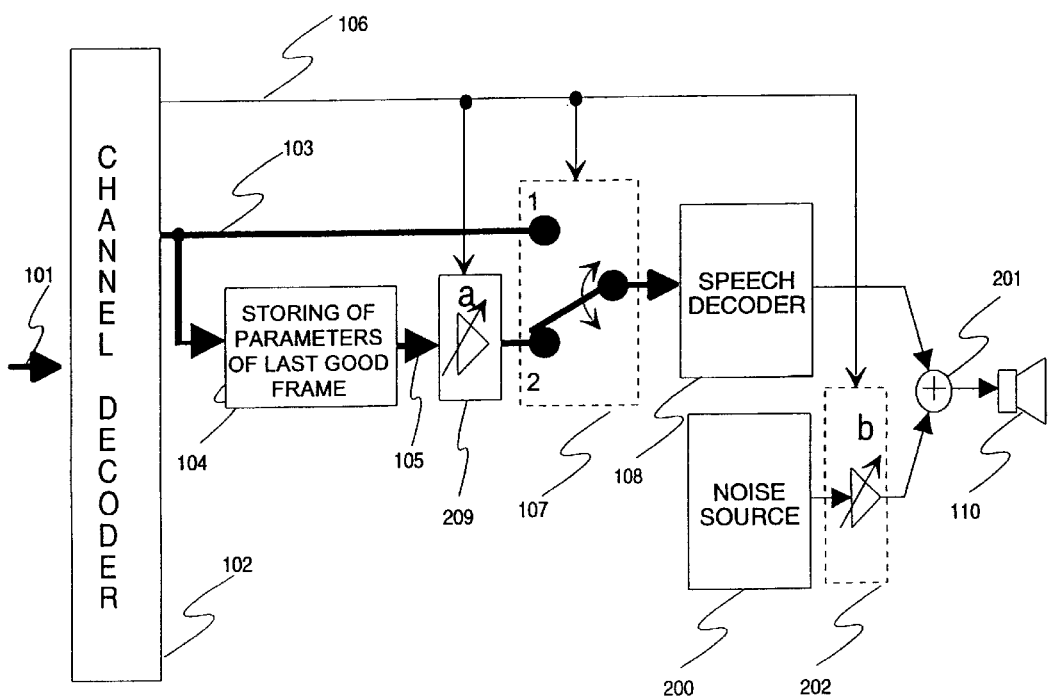

The invention can also be applied by a way shown in FIG. 2b to a prior art bad frame substitution method according to the second embodiment illustrated in FIG. 1b. In the arrangement according to FIG. 2b, a noise source 200, a summer 201 and a controllable attenuator 202 have been added. The operation of these devices equals that disclosed in connection with FIGS. 2a and 2c, and their operation is not described in any closer detail here.

Figure 3:
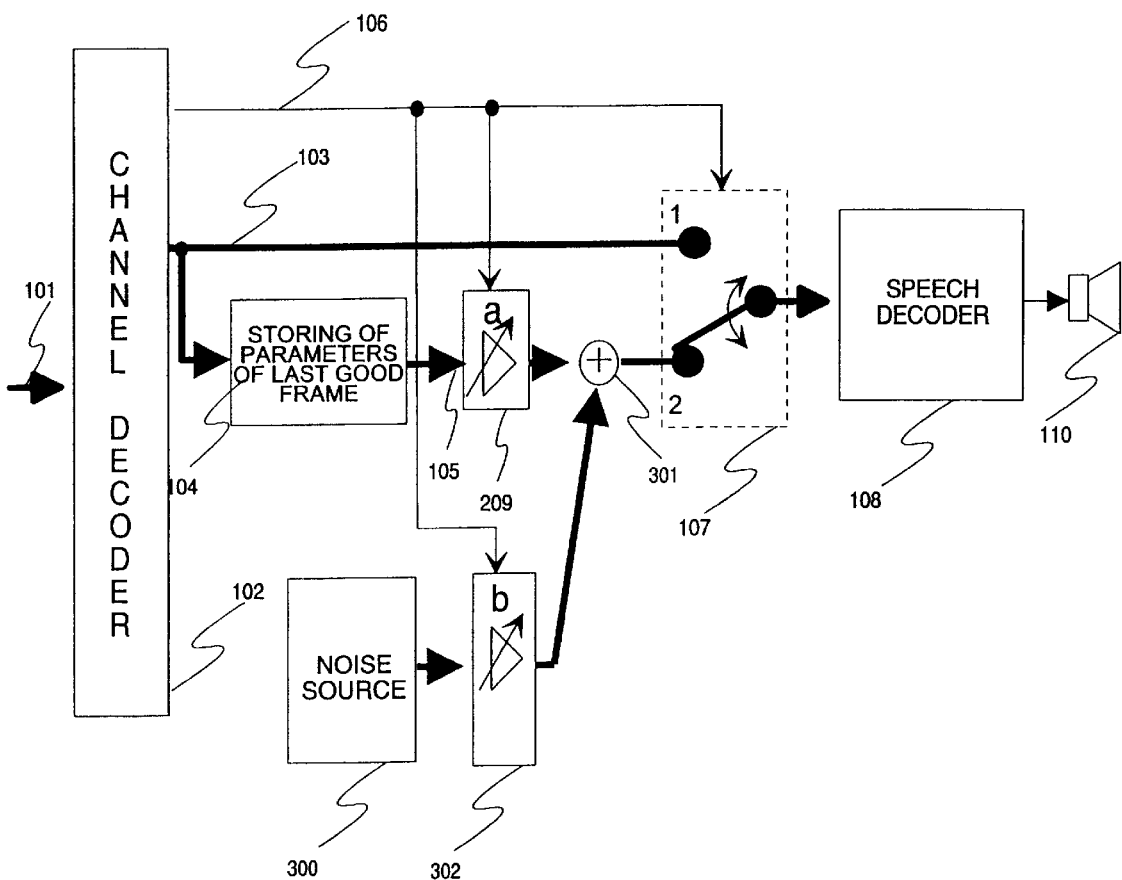
FIG. 3 shows a second embodiment of a substitution process for bad frames.

FIG. 3 illustrates a third embodiment of the invention as applied to the prior art arrangement of FIG. 1b. According to this embodiment, the noise signal is summed with the parameters of the speech frames prior to applying them to the speech coder. Thus, the difference compared to the embodiment of FIG. 2b is that during the substitution process, when the switch 107 is in position 2, the signal formed at the receiver to be applied to the audio speaker is formed as a weighted sum of the last parameters received from the transmission channel and the noise parameters obtained from the noise source 300. The extent of the influence of the noise source is controlled in the attenuation block 302 wherein the parameter, e.g. the gain parameter of an excitation signal of LPC type speech coders, influencing the amplitude of the speech to be synthesized, is increased from zero during the substitution process, i.e. from the state during which noise is not at all generated, up to the constant value, i.e. the state in which the noise signal generated at the speech coder by means of the noise parameters is of constant level. In the summing means 301, the noise parameters are softly the more efficiently combined with the parameters of the last good frame received, the larger number of successive bad speech frames are received. The extent of the combining can be influenced by controlling, according to the classification signal 106, the speech coding parameters "a" and "b" which influence the amplitude of the speech signal to be synthesized in the blocks 209 and 302, as described in FIG. 2c. If a large number of successive bad frames have been received, the signal formed at the receiver to be applied to the audio speaker is generated solely on the basis of the parameters obtained from the noise source 300. However, this is so carrier out that the magnitude of the noise generated at the receiver is saturated to a constant value during the substitution method by controlling the speech coding parameter that influences the amplitude.

It should be understood that the description above and the figures relating to it are only intended to illustrate the present invention. Different kinds of variations and modifications of the present invention will become obvious for a person skilled in the art, without departing from the scope and spirit of the invention disclosed in the attached claims. The noise source, for example, does not have to generate noise, but it can provide any kind of signal indicating to the called party that the call has not yet completely broken.

What is claimed is:

1. A method for substituting bad speech frames in a receiver of a digital communication system, the method comprising:

carrying out a correct/defective classification for each received frame containing speech coding parameters, wherein if the frame is classified as defective, a substitution process is carried out prior to applying the frame to a speech decoder, in which process the parameters of the frame are substituted for other parameters, the synthesized speech is attenuated during the substitution process, upon attenuating speech synthesized in the substitution process, the output signal of the receiver is combined with a noise signal which, after the synthesized speech completely ends, indicates the ceasing of the speech synthesization, and when good speech frames are received following a bad speech frame, the output signal of the receiver is formed so that the portion of noise signal combined with it decreases in the summing process in proportion to the number of received successive good frames, until the output signal is finally formed solely on the basis of the speech coding parameters received from the transmission channel.

2. A receiver of a digital communication system transmitting speech, the receiver comprising:

a channel decoder for forming speech frames containing speech coding parameters and for providing a classification signal for them, the classification signal being indicative of whether the received frame is correct or defective, a storing means for storing the last correct speech frame, a speech decoder to whose input a switch controlled by the classification signal direct either the parameters of the frame obtained from the channel decoder or the parameters of the frame obtained from the storing means, and from the output of which speech decoder the signal to be applied to the audio speaker is obtained, and means responsive to the classification signal for creating noise and adding the noise to the signal to be applied to the audio speaker, wherein the means for creating noise comprises a first noise source, an adjustable first attenuator for attenuating the noise signal obtained from the noise source, and a summer the inputs of which are the output signal from the first attenuator and a signal proportional to the signal obtained from the storing means.

3. A receiver as claimed in claim 2, wherein the signal proportional to the signal obtained from the storing means is the output signal of the storing means which has been attenuated in an adjustable second attenuator.

4. A receiver as claimed in claim 2, wherein the attenuation of the first attenuator and the attenuation of the second attenuator are controlled by the classification signal.

5. A method for substituting defective speech frames in a receiver of a digital communication system, the method comprising:

carrying out a correct/defective classification for each received frame containing speech coding parameters;

carrying out a substitution process prior to applying the frame to a speech decoder if the frame is classified as defective, in which said substitution process the parameters of the frame are substituted for other parameters, and a synthesized speech signal is attenuated; and providing, while attenuating speech synthesized in the substitution process, an output signal of the receiver as a weighted sum of (i) a noise signal obtained from a noise source and (ii) the synthesized speech signal obtained from the speech decoder, the noise signal being an indication of termination of speech synthesization.

6. A method as claimed in claim 5, wherein a level of the summed noise signal is increased when a number of successively received defective frames increases.

7. A method as claimed in claim 5, wherein, upon receiving a predetermined number of successive defective frames, speech synthesized in the substitution process becomes muted and the output signal of the receiver consists solely of the noise signal, an amplitude of the noise signal being adjusted to a constant level during the substitution process.

8. A method as claimed in claim 5, wherein, when correct speech frames are received following a defective speech frame and the synthesization is restarted, a level of the synthesized speech is increased and a level of the noise signal is decreased in the summing process as a number of successively received correct frames increases, until the output signal is formed solely on the basis of the speech coding parameters.

9. A method for substituting defective speech frames in a receiver of a digital communication system, the method comprising:

carrying out a correct/defective classification for each received frame containing speech coding parameters;

carrying out a substitution process prior to applying the frame to a speech decoder if the frame is classified as defective, in which said substitution process the parameters of the frame are substituted for other parameters, and a synthesized speech signal is attenuated;

providing, while attenuating speech synthesized in the substitution process, an output of the receiver as a weighted sum of (i) the parameters of the substituted frame and (ii) noise parameters obtained from a noise source; and applying the weighted sum of the parameters to the speech decoder, so that the output signal of the receiver includes a noise signal which, after the synthesized speech ends, indicates termination of speech synthesization.

10. A method as claimed in claim 9, wherein the weight of the noise parameters is increased as a number of successively received bad frames increases.

11. A method as claimed in claim 9, wherein the noise weighting is controlled by adjusting at least one speech coding parameter influencing amplitude of the speech signal to be synthesized.

12. A method as claimed in claim 11, wherein upon receiving a predetermined number of successive defective frames, the output signal is solely formed by using parameters obtained from the noise source, and wherein a level of the noise signal is increased by a speech coding parameter which influences amplitude of the speech signal to a predetermined constant level during the substitution process.

13. A method as claimed in claim 9 wherein, when correct speech frames are received following a defective speech frame and the synthesization is restarted, a level of the synthesized speech is increased and a level of the noise signal is increased in a summing process as a number of successively received correct frames increases, until the output signal is formed solely on the basis of the speech coding parameters received.

14. A receiver of a digital communication system transmitting speech, the receiver comprising:

a channel decoder forming speech frames containing speech coding parameters and for providing a classification signal indicative of whether a received frame is correct or defective;

storing means for storing a last correct speech frame;

a switch responsive to the classification signal and providing as an output, either of the speech coding parameters or the parameters of the last correct speech frame;

a speech decoder receiving as an input, the output of the switch, and producing a decoder output thereby; and means responsive to the classification signal for adding noise to the decoder output, said means comprising a first noise source, an adjustable first attenuator for attenuating a noise signal obtained from the noise source, and a first summer, the first summer having as an input, an output signal from the first attenuator and a signal proportional to the decoder output;

wherein the means responsive to the classification signal (i) produces an output and (ii) provides the produced output to an audio speaker.

15. A receiver as claimed in claim 14, wherein the signal proportional to the output signal of the speech decoder is the speech decoder output signal which has been attenuated in an adjustable second attenuator.

16. A receiver as claimed in claim 14, wherein the signal proportional to the signal obtained from the storing means is an output signal of the storing means which has been attenuated in an adjustable second attenuator.

17. A receiver as claimed in claim 14, wherein the attenuation of the first attenuator and the attenuation of the second attenuator are controlled by the classification signal.

18. A method for processing speech frames in a receiver of a digital communications system, the method comprising:

processing a speech frame provided as an input to the receiver;

wherein the processing includes providing speech parameter values for the speech frame;

determining if the processed frame is corrupted based upon the speech parameter values and providing a signal in response thereto;

providing speech parameters from a last one of a number of good frames;

applying to a speech decoder, based upon the signal, (i) the speech parameter values if the processed frame is uncorrupted, or (ii) the speech parameters from the last one of the number of last good frames if the processed frame is corrupted, and (iii) the speech decoder producing a decoder output thereby;

attenuating a magnitude of the decoder output (i) when the processed frame is corrupted and (ii) when the number of last good frames exceeds a predetermined value, the attenuating producing an attenuating output thereby;

mixing the attenuating output with a noise signal, a magnitude of the noise signal being responsive to the attenuating output, and the mixing producing a mixed signal thereby; and providing the mixed signal to an output of the receiver.

* * * * *